(12) United States Patent
Sorensen et al.

(10) Patent No.: US 8,255,009 B2
(45) Date of Patent: Aug. 28, 2012

(54) RADIO FREQUENCY COMMUNICATIONS CIRCUITRY WITH POWER SUPPLY VOLTAGE AND GAIN CONTROL

(75) Inventors: Robert Sorensen, Fremont, CA (US); Ronald William Dimpflmaier, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 703 days.

(21) Appl. No.: 12/110,260

(22) Filed: Apr. 25, 2008

(65) Prior Publication Data
US 2009/0270137 A1 Oct. 29, 2009

(51) Int. Cl.
*H04M 1/00* (2006.01)

(52) U.S. Cl. .... 455/572; 455/571; 455/13.4; 455/127.2; 455/341; 455/311

(58) Field of Classification Search ................. 455/572, 455/573, 522, 13.4, 69, 220, 177.1, 200.1, 455/219, 250.1, 247.1, 245.1, 251.1, 341, 455/343.2, 355, 110, 127, 73, 91, 127.5, 455/574, 127.1, 127.2, 127.3, 333, 323, 324, 455/231.1, 571, 311, 308, 293, 78, 550.1; 330/297, 131, 136, 129, 279, 285, 2, 147, 330/51, 268; 375/298; 320/127
See application file for complete search history.

(56) References Cited

U.S. PATENT DOCUMENTS

| | | | | |
|---|---|---|---|---|
| 3,613,011 A | * | 10/1971 | Wood | 455/267 |
| 4,709,404 A | * | 11/1987 | Tamura et al. | 455/126 |
| 5,055,797 A | * | 10/1991 | Chater | 330/268 |
| 5,182,527 A | * | 1/1993 | Nakanishi et al. | 330/285 |
| 5,410,276 A | * | 4/1995 | Hwang et al. | 330/297 |
| 6,008,698 A | * | 12/1999 | Dacus et al. | 330/279 |
| 6,163,706 A | | 12/2000 | Rozenblit et al. | |
| 6,178,313 B1 | * | 1/2001 | Mages et al. | 455/127.2 |
| 6,323,729 B1 | * | 11/2001 | Sevenhans et al. | 330/51 |
| 6,377,825 B1 | | 4/2002 | Kennedy | |
| 6,624,702 B1 | * | 9/2003 | Dening | 330/297 |

(Continued)

FOREIGN PATENT DOCUMENTS

EP 1237297 A2 4/2002

(Continued)

OTHER PUBLICATIONS

Sorensen, U.S. Appl. No. 12/330,497, filed Dec. 8, 2008.

(Continued)

*Primary Examiner* — Tan Trinh
(74) *Attorney, Agent, or Firm* — Treyz Law Group; Chih-Yun Wu; G. Victor Treyz

(57) ABSTRACT

Portable electronic devices are provided with wireless circuitry. The wireless circuitry may include one or more sets of radio-frequency power amplifiers. The radio-frequency power amplifiers are used to amplify radio-frequency signals that are transmitted by the portable electronic devices. Each power amplifier may have multiple gain mode settings. Gain stages within the power amplifiers may be selectively enabled in accordance with the gain mode settings. When a higher level of gain is required, all of the gain stages may be enabled. When a lower level of gain is required, some of the gain stages may be disabled to conserve power. An adjustable power supply may be used to provide an adjustable power supply voltage to the power amplifiers. The adjustable power supply voltage can be reduced when it is desired to minimize power consumption at a particular gain mode setting. Gain mode and power supply settings may be adjusted simultaneously.

21 Claims, 12 Drawing Sheets

U.S. PATENT DOCUMENTS

| | | | |
|---|---|---|---|
| 6,735,422 B1 | 5/2004 | Baldwin et al. | |
| 6,819,910 B2 | 11/2004 | Shi et al. | |
| 6,819,938 B2 | 11/2004 | Sahota | |
| 7,110,469 B2 | 9/2006 | Shi et al. | |
| 7,289,778 B2 * | 10/2007 | Sasaki | 455/127.5 |
| 7,342,955 B2 | 3/2008 | Forest et al. | |
| 7,398,106 B2 | 7/2008 | Conyers et al. | |
| 7,558,539 B2 | 7/2009 | Huynh et al. | |
| 7,639,072 B2 * | 12/2009 | Sorrells et al. | 330/2 |
| 7,962,109 B1 | 6/2011 | Stockstad et al. | |
| 7,970,427 B2 | 6/2011 | Agahi et al. | |
| 7,978,621 B2 * | 7/2011 | Rofougaran | 370/252 |
| 8,032,189 B2 * | 10/2011 | Guthrie et al. | 455/574 |
| 2002/0042256 A1 * | 4/2002 | Baldwin et al. | 455/232.1 |
| 2002/0135343 A1 * | 9/2002 | Underbrink et al. | 323/283 |
| 2004/0041538 A1 * | 3/2004 | Sklovsky | 320/127 |
| 2004/0176145 A1 | 9/2004 | Lee et al. | |
| 2004/0192408 A1 | 9/2004 | Sharp et al. | |
| 2005/0136869 A1 | 6/2005 | Liu | |
| 2005/0186923 A1 | 8/2005 | Chen et al. | |
| 2006/0046668 A1 | 3/2006 | Uratani et al. | |
| 2006/0068830 A1 | 3/2006 | Klomsdorf et al. | |
| 2006/0223486 A1 * | 10/2006 | Ruff et al. | 455/343.1 |
| 2006/0246859 A1 * | 11/2006 | Rofougaran et al. | 455/127.3 |
| 2006/0252392 A1 | 11/2006 | Beamish et al. | |
| 2007/0066250 A1 * | 3/2007 | Takahashi et al. | 455/127.1 |
| 2007/0135071 A1 * | 6/2007 | Lee et al. | 455/232.1 |
| 2007/0249304 A1 * | 10/2007 | Snelgrove et al. | 455/127.2 |
| 2007/0291873 A1 * | 12/2007 | Saito et al. | 375/298 |
| 2008/0002786 A1 | 1/2008 | Kerth et al. | |
| 2008/0014997 A1 * | 1/2008 | Guthrie et al. | 455/572 |
| 2008/0284510 A1 * | 11/2008 | Drogi et al. | 330/136 |
| 2009/0068966 A1 * | 3/2009 | Drogi et al. | 455/127.1 |
| 2009/0264148 A1 * | 10/2009 | Tom | 455/550.1 |
| 2010/0112967 A1 * | 5/2010 | Sorensen | 455/127.2 |
| 2010/0291975 A1 * | 11/2010 | Dimpflmaier et al. | 455/572 |
| 2012/0021709 A1 * | 1/2012 | Guthrie et al. | 455/127.5 |

FOREIGN PATENT DOCUMENTS

| | | |
|---|---|---|
| EP | 1986331 A1 | 10/2008 |
| JP | 2003163607 A | 8/2005 |
| WO | 9849771 A1 | 4/1998 |
| WO | 0122604 A1 | 3/2001 |
| WO | 03075452 A2 | 9/2003 |
| WO | 2004077664 A1 | 9/2004 |
| WO | 2007149346 A2 | 12/2007 |

OTHER PUBLICATIONS

Takeya et al., U.S. Appl. No. 12/125,534, filed May 28, 2008.
Dimpflmaier et al, U.S. Appl. No. 12/465,260, filed May 13, 2009.
Sorensen, U.S. Appl. No. 12/262,121, filed Oct. 30, 2008.
"R&S CMU200 Universal Radio Communication Tester", Rohde & Schwarz, Nov. 2007.
Motorola, "Comparison of PAR and Cubic Metric for Power Derating", 3GPP Draft, R1-040642_EU9.5CUBICMETRIC, 3rd Generation Partnership Project (3GPP), Mobile Competence Centre, 650, Route Des Lucioles, F-06921 Sophia-Antipolis Cedex, France, vol. RAN WG4, no. Prague, Czech Republic, 20040812, Aug. 12, 2004, XP05017315.
"Understanding the Cubic Metric," [online]. Agilent Technologies, Inc. 2000-2009 [retrieved on Apr. 2, 2009] <URL: http://wireless.agilent.com/wireless/helpfiles/n7600b/cubic_metric.htm>.

* cited by examiner

RADIO FREQUENCY COMMUNICATIONS CIRCUITRY WITH POWER SUPPLY VOLTAGE AND GAIN CONTROL

BACKGROUND

This invention relates generally to wireless communications circuitry, and more particularly, to wireless communications circuitry with power management capabilities.

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Due in part to their mobile nature, portable electronic devices are often provided with wireless communications capabilities. For example, handheld electronic devices may use long-range wireless communications to communicate with wireless base stations. Cellular telephones and other devices with cellular capabilities may communicate using cellular telephone bands at 850 MHz, 900 MHz, 1800 MHz, and 1900 MHz. Portable electronic devices may also use short-range wireless communications links. For example, portable electronic devices may communicate using the Wi-Fi® (IEEE 802.11) bands at 2.4 GHz and 5.0 GHz and the Bluetooth® band at 2.4 GHz. Communications are also possible in data service bands such as the 3G data communications band at 2170 MHz band (commonly referred to as UMTS or Universal Mobile Telecommunications System band). The use of 3G communications schemes for supporting voice communications is also possible.

To satisfy consumer demand for small form factor wireless devices, manufacturers are continually striving to reduce the size of components that are used in these devices. For example, manufacturers have made attempts to miniaturize the batteries used in handheld electronic devices.

An electronic device with a small battery has limited battery capacity. Unless care is taken to consume power wisely, an electronic device with a small battery may exhibit unacceptably short battery life. Techniques for reducing power consumption may be particularly important in wireless devices that support cellular telephone communications, because users of cellular telephone devices often demand long "talk" times.

It would therefore be desirable to be able to provide wireless communications circuitry with improved power management capabilities.

SUMMARY

A portable electronic device such as a handheld electronic device is provided with wireless communications circuitry that includes power management capabilities. The wireless communications circuitry may include a radio-frequency transceiver and antenna structures. Power amplifiers may be provided to amplify radio-frequency signals from the transceiver before they are transmitted from the portable electronic device using the antenna structures.

The portable electronic device may be powered by a battery. The battery voltage may vary as a function of time. For example, as the battery becomes depleted, the battery voltage may drop. As a result, the battery voltage at the beginning of its life may be excessive. To avoid unnecessarily high levels of power consumption by the power amplifier circuitry at the beginning of the battery's life when the battery voltage is elevated, power supply circuitry may be used to regulate the power supply voltage that is supplied to the power amplifiers.

The power amplifiers may contain multiple selectively enabled gain stages. When it is desired to operate in a high gain mode, the gain stages may all be enabled. When it not necessary to produce large output powers, power consumption by the power amplifiers can be reduced by placing the power amplifiers in one or more lower gain modes of operation. During the lower gain modes of operation, one or more of the gain stages are selectively disabled.

The power supply voltage that is provided to the power amplifier may be adjusted in real time to accommodate desired power amplifier output power requirements while minimizing power consumption. Both power supply voltage adjustments and gain mode adjustments may be made simultaneously to optimize performance.

Further features of the invention, its nature and various advantages will be more apparent from the accompanying drawings and the following detailed description of the preferred embodiments.

DETAILED DESCRIPTION

The present invention relates generally to wireless communications, and more particularly, to managing power consumption by wireless communications circuitry in wireless electronic devices.

The wireless electronic devices may be portable electronic devices such as laptop computers or small portable computers of the type that are sometimes referred to as ultraportables. Portable electronic devices may also be somewhat smaller devices. Examples of smaller portable electronic devices include wrist-watch devices, pendant devices, headphone and earpiece devices, and other wearable and miniature devices. With one suitable arrangement, the portable electronic devices may be handheld electronic devices.

The wireless electronic devices may be, for example, cellular telephones, media players with wireless communications capabilities, handheld computers (also sometimes called personal digital assistants), remote controllers, global positioning system (GPS) devices, and handheld gaming devices. The wireless electronic devices may also be hybrid devices that combine the functionality of multiple conventional devices. Examples of hybrid portable electronic devices include a cellular telephone that includes media player functionality, a gaming device that includes a wireless communications capability, a cellular telephone that includes game and email functions, and a portable device that receives email, supports mobile telephone calls, has music player functionality and supports web browsing. These are merely illustrative examples.

Figure 1:
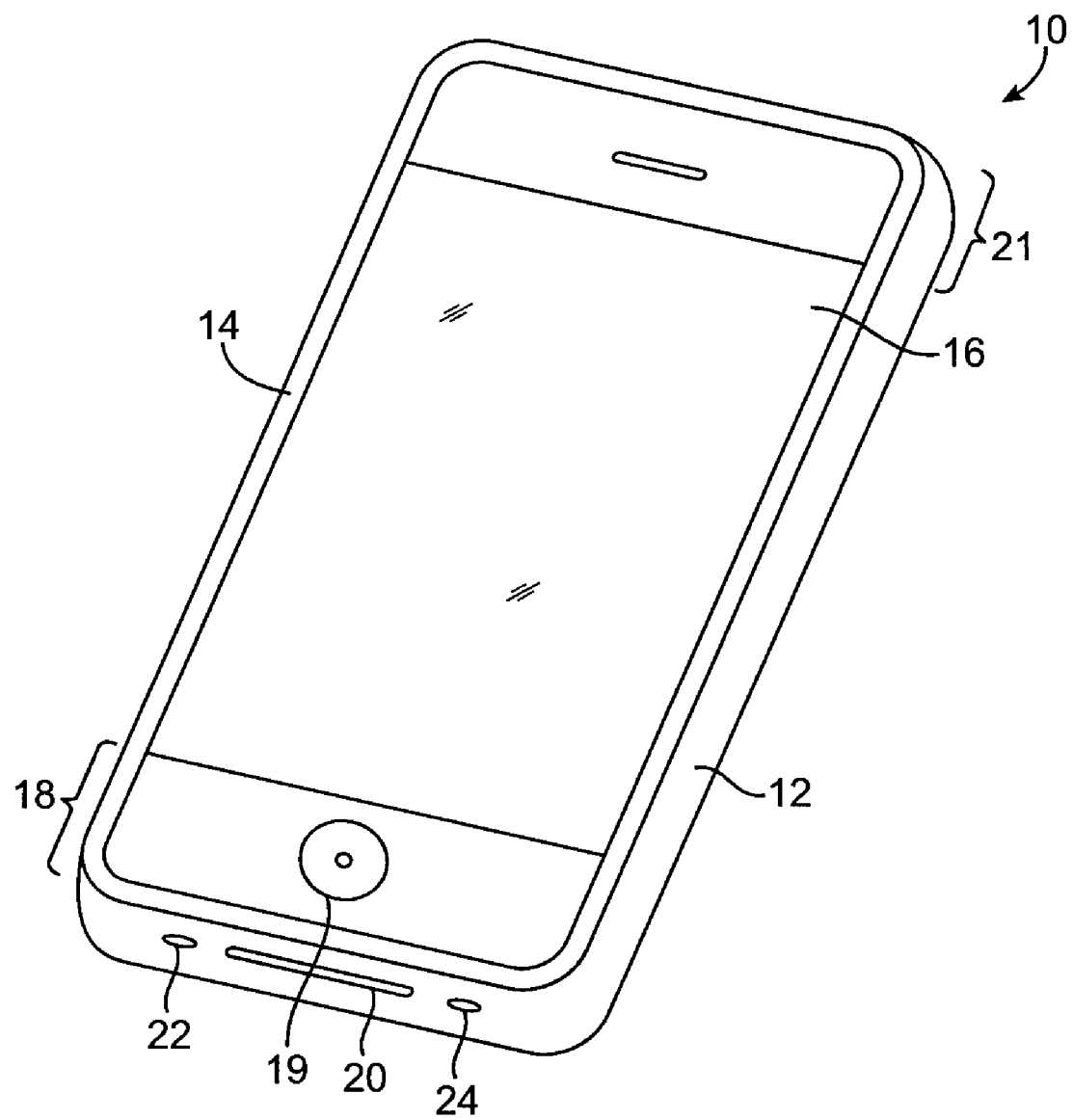
FIG. 1 is a perspective view of an illustrative electronic device in which wireless communications circuitry with power management capabilities may be used in accordance with an embodiment of the present invention.

An illustrative portable electronic device in accordance with an embodiment of the present invention is shown in FIG. 1. Device 10 of FIG. 1 may be, for example, a handheld electronic device.

Device 10 may have housing 12. Antennas for handling wireless communications may be housed within housing 12 (as an example).

Housing 12, which is sometimes referred to as a case, may be formed of any suitable materials including, plastic, glass, ceramics, metal, or other suitable materials, or a combination of these materials. In some situations, housing 12 or portions of housing 12 may be formed from a dielectric or other low-conductivity material, so that the operation of conductive antenna elements that are located in proximity to housing 12 is not disrupted. Housing 12 or portions of housing 12 may also be formed from conductive materials such as metal. An illustrative housing material that may be used is anodized aluminum. Aluminum is relatively light in weight and, when anodized, has an attractive insulating and scratch-resistant surface. If desired, other metals can be used for the housing of device 10, such as stainless steel, magnesium, titanium, alloys of these metals and other metals, etc. In scenarios in which housing 12 is formed from metal elements, one or more of the metal elements may be used as part of the antennas in device 10. For example, metal portions of housing 12 may be shorted to an internal ground plane in device 10 to create a larger ground plane element for that device 10. To facilitate electrical contact between an anodized aluminum housing and other metal components in device 10, portions of the anodized surface layer of the anodized aluminum housing may be selectively removed during the manufacturing process (e.g., by laser etching).

Housing 12 may have a bezel 14. The bezel 14 may be formed from a conductive material and may serve to hold a display or other device with a planar surface in place on device 10. As shown in FIG. 1, for example, bezel 14 may be used to hold display 16 in place by attaching display 16 to housing 12.

Display 16 may be a liquid crystal diode (LCD) display, an organic light emitting diode (OLED) display, or any other suitable display. The outermost surface of display 16 may be formed from one or more plastic or glass layers. If desired, touch screen functionality may be integrated into display 16 or may be provided using a separate touch pad device. An advantage of integrating a touch screen into display 16 to make display 16 touch sensitive is that this type of arrangement can save space and reduce visual clutter.

Display screen 16 (e.g., a touch screen) is merely one example of an input-output device that may be used with electronic device 10. If desired, electronic device 10 may have other input-output devices. For example, electronic device 10 may have user input control devices such as button 19, and input-output components such as port 20 and one or more input-output jacks (e.g., for audio and/or video). Button 19 may be, for example, a menu button. Port 20 may contain a 30-pin data connector (as an example). Openings 24 and 22 may, if desired, form microphone and speaker ports. In the example of FIG. 1, display screen 16 is shown as being mounted on the front face of handheld electronic device 10, but display screen 16 may, if desired, be mounted on the rear face of handheld electronic device 10, on a side of device 10, on a flip-up portion of device 10 that is attached to a main body portion of device 10 by a hinge (for example), or using any other suitable mounting arrangement.

A user of electronic device 10 may supply input commands using user input interface devices such as button 19 and touch screen 16. Suitable user input interface devices for electronic device 10 include buttons (e.g., alphanumeric keys, power on-off, power-on, power-off, and other specialized buttons, etc.), a touch pad, pointing stick, or other cursor control device, a microphone for supplying voice commands, or any other suitable interface for controlling device 10. Although shown schematically as being formed on the top face of electronic device 10 in the example of FIG. 1, buttons such as button 19 and other user input interface devices may generally be formed on any suitable portion of electronic device 10. For example, a button such as button 19 or other user interface control may be formed on the side of electronic device 10. Buttons and other user interface controls can also be located on the top face, rear face, or other portion of device 10. If desired, device 10 can be controlled remotely (e.g., using an infrared remote control, a radio-frequency remote control such as a Bluetooth remote control, etc.).

Electronic device 10 may have ports such as port 20. Port 20, which may sometimes be referred to as a dock connector, 30-pin data port connector, input-output port, or bus connector, may be used as an input-output port (e.g., when connecting device 10 to a mating dock connected to a computer or other electronic device). Device 10 may also have audio and video jacks that allow device 10 to interface with external components. Typical ports include power jacks to recharge a battery within device 10 or to operate device 10 from a direct current (DC) power supply, data ports to exchange data with external components such as a personal computer or peripheral, audio-visual jacks to drive headphones, a monitor, or other external audio-video equipment, a subscriber identity module (SIM) card port to authorize cellular telephone service, a memory card slot, etc. The functions of some or all of these devices and the internal circuitry of electronic device 10 can be controlled using input interface devices such as touch screen display 16.

Components such as display 16 and other user input interface devices may cover most of the available surface area on the front face of device 10 (as shown in the example of FIG. 1) or may occupy only a small portion of the front face of device 10. Because electronic components such as display 16 often contain large amounts of metal (e.g., as radio-frequency shielding), the location of these components relative to the antenna elements in device 10 should generally be taken into consideration. Suitably chosen locations for the antenna elements and electronic components of the device will allow the antennas of electronic device 10 to function properly without being disrupted by the electronic components.

Examples of locations in which antenna structures may be located in device 10 include region 18 and region 21. These are merely illustrative examples. Any suitable portion of device 10 may be used to house antenna structures for device 10 if desired.

If desired, electronic device 10 may be a portable electronic device such as a laptop or other portable computer. For example, electronic device 10 may be an ultraportable computer, a tablet computer, or other suitable portable computing device. Electronic device 10 may also be a handheld device. Power management considerations are particularly important in small devices such as handheld devices, because space is at a premium in small devices which limits that amount of space available for batteries.

Figure 2:
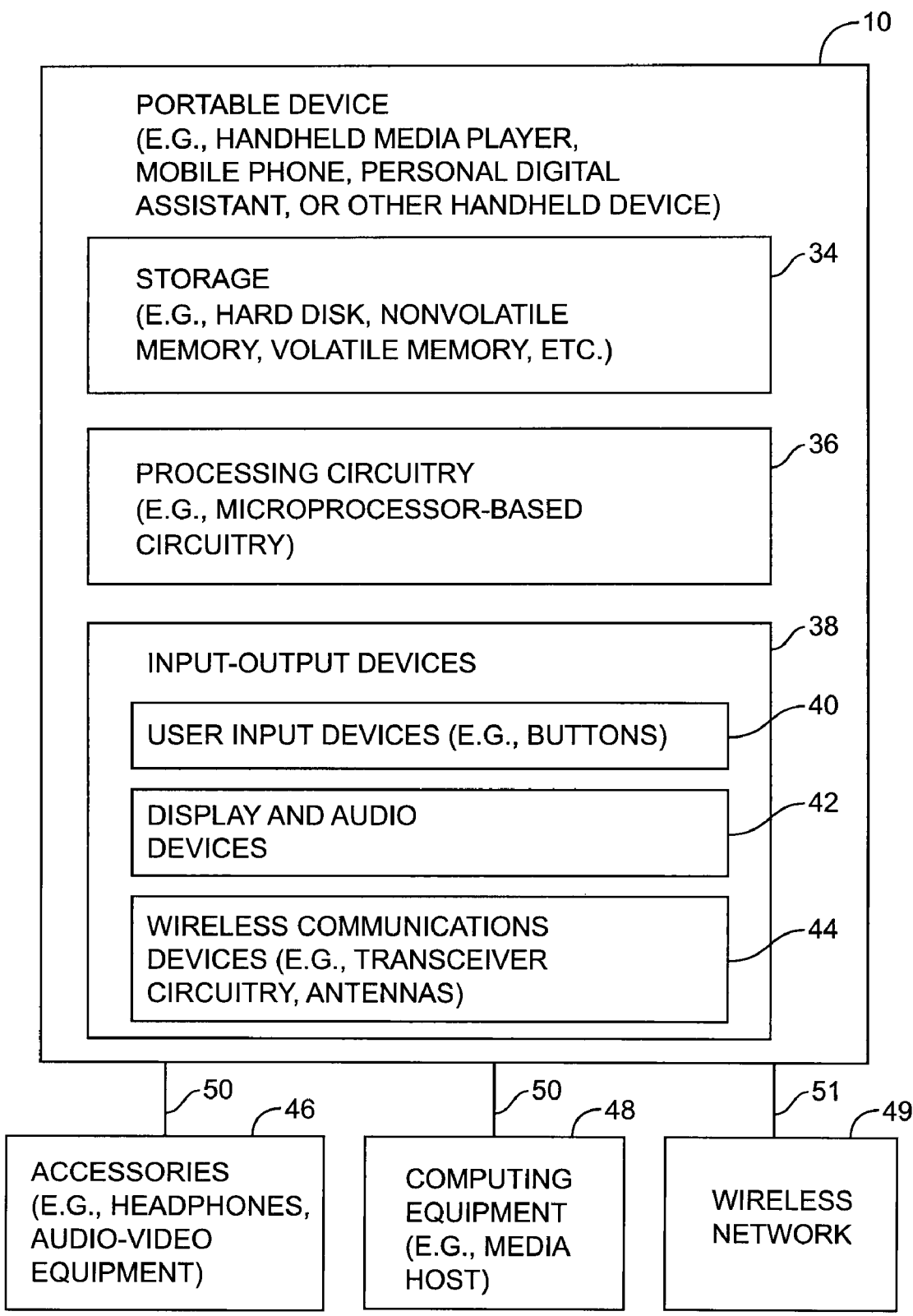
FIG. 2 is a schematic diagram of an illustrative portable electronic device in accordance with an embodiment of the present invention.

A schematic diagram of an embodiment of an illustrative portable electronic device such as a handheld electronic device is shown in FIG. 2. Portable device 10 may be a mobile telephone, a mobile telephone with media player capabilities, a handheld computer, a remote control, a game player, a global positioning system (GPS) device, a laptop computer, a tablet computer, an ultraportable computer, a combination of such devices, or any other suitable portable electronic device.

As shown in FIG. 2, device 10 may include storage 34. Storage 34 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 36 may be used to control the operation of device 10. Processing circuitry 36 may be based on a processor such as a microprocessor and other suitable integrated circuits. With one suitable arrangement, processing circuitry 36 and storage 34 are used to run software on device 10, such as internet browsing applications, voice-over-internet-protocol (VOIP) telephone call applications, email applications, media playback applications, operating system functions, etc. Processing circuitry 36 and storage 34 may be used in implementing suitable communications protocols. Communications protocols that may be implemented using processing circuitry 36 and storage 34 include internet protocols, wireless local area network protocols (e.g., IEEE 802.11 protocols—sometimes referred to as Wi-Fi®), protocols for other short-range wireless communications links such as the Bluetooth® protocol, protocols for handling 3G data services such as UMTS, cellular telephone communications protocols, etc.

To minimize power consumption, processing circuitry 36 or other suitable control circuitry on device 10 may be used in implementing power management functions. For example, processing circuitry 36 may be used to adjust the gain of radio-frequency power amplifier circuitry on device 10 and may be used to adjust the power supply voltages that are used in powering the radio-frequency power amplifier circuitry. These adjustments may be made automatically in real time. For example, processing circuitry 36 may be used to implement a control scheme in which the power amplifier circuitry is adjusted to accommodate transmission power level requests received from a wireless network.

Input-output devices 38 may be used to allow data to be supplied to device 10 and to allow data to be provided from device 10 to external devices. Display screen 16, button 19, microphone port 24, speaker port 22, and dock connector port 20 are examples of input-output devices 38.

Input-output devices 38 can include user input-output devices 40 such as buttons, touch screens, joysticks, click wheels, scrolling wheels, touch pads, key pads, keyboards, microphones, cameras, etc. A user can control the operation of device 10 by supplying commands through user input devices 40. Display and audio devices 42 may include liquid-crystal display (LCD) screens or other screens, light-emitting diodes (LEDs), and other components that present visual information and status data. Display and audio devices 42 may also include audio equipment such as speakers and other devices for creating sound. Display and audio devices 42 may contain audio-video interface equipment such as jacks and other connectors for external headphones and monitors.

Wireless communications devices 44 may include communications circuitry such as radio-frequency (RF) transceiver circuitry formed from one or more integrated circuits, power amplifier circuitry (e.g., power amplifier circuitry that is controlled by control signals from processing circuitry 36 to minimize power consumption), passive RF components, antennas, and other circuitry for handling RF wireless signals. Wireless signals can also be sent using light (e.g., using infrared communications).

Device 10 can communicate with external devices such as accessories 46, computing equipment 48, and wireless network 49 as shown by paths 50 and 51. Paths 50 may include wired and wireless paths. Path 51 may be a wireless path. Accessories 46 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 48 may be any suitable computer. With one suitable arrangement, computing equipment 48 is a computer that has an associated wireless access point (router) or an internal or external wireless card that establishes a wireless connection with device 10. The computer may be a server (e.g., an internet server), a local area network computer with or without internet access, a user's own personal computer, a peer device (e.g., another portable electronic device 10), or any other suitable computing equipment.

Wireless network 49 may include any suitable network equipment, such as cellular telephone base stations, cellular towers, wireless data networks, computers associated with wireless networks, etc. For example, wireless network 49 may include network management equipment that monitors the wireless signal strength of the wireless handsets (cellular telephones, handheld computing devices, etc.) that are in communication with network 49.

To improve the overall performance of the network and to ensure that interference between handsets is minimized, the network management equipment may send power adjustment commands (sometimes referred to as transmit power control commands) to each handset. The transmit power control settings that are provided to the handsets direct handsets with weak signals to increase their transmit powers, so that their signals will be properly received by the network. At the same time, the transmit power control settings may instruct handsets whose signals are being received clearly at high power to reduce their transmit power control settings. This reduces interference between handsets and allows the network to maximize its use of available wireless bandwidth.

When devices such as device 10 receive transmit power control settings from the network, each device 10 may make suitable transmission power adjustments. For example, a device 10 may adjust the radio-frequency power amplifiers that are used to amplify the radio-frequency signals that are being transmitted by device 10. These adjustments may include gain mode settings adjustments and power supply voltage adjustments. Gain mode adjustments control the gain setting of the power amplifier. For example, a gain mode adjustment may control whether a power amplifier is operating in a high gain mode in which all power amplifier stages that are available are being used or a low gain mode in which one or more of the gain stages on the power amplifier have been shut down to conserve power. Power supply voltage adjustments may be used to help minimize power consumption at a given gain setting.

The antenna structures and wireless communications devices of device 10 may support communications over any suitable wireless communications bands. For example, wireless communications devices 44 may be used to cover communications frequency bands such as cellular telephone voice and data bands at 850 MHz, 900 MHz, 1800 MHz, 1900 MHz, and the communications band data at 2170 MHz band (commonly referred to as a UMTS or Universal Mobile Telecommunications System band), the Wi-Fi® (IEEE 802.11) bands at 2.4 GHz and 5.0 GHz (also sometimes referred to as wireless local area network or WLAN bands), the Bluetooth® band at 2.4 GHz, and the global positioning system (GPS) band at 1550 MHz.

Device 10 can cover these communications bands and/or other suitable communications bands with proper configuration of the antenna structures in wireless communications circuitry 44. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands. These are merely illustrative arrangements. Any suitable antenna structures may be used in device 10 if desired.

Figure 3:
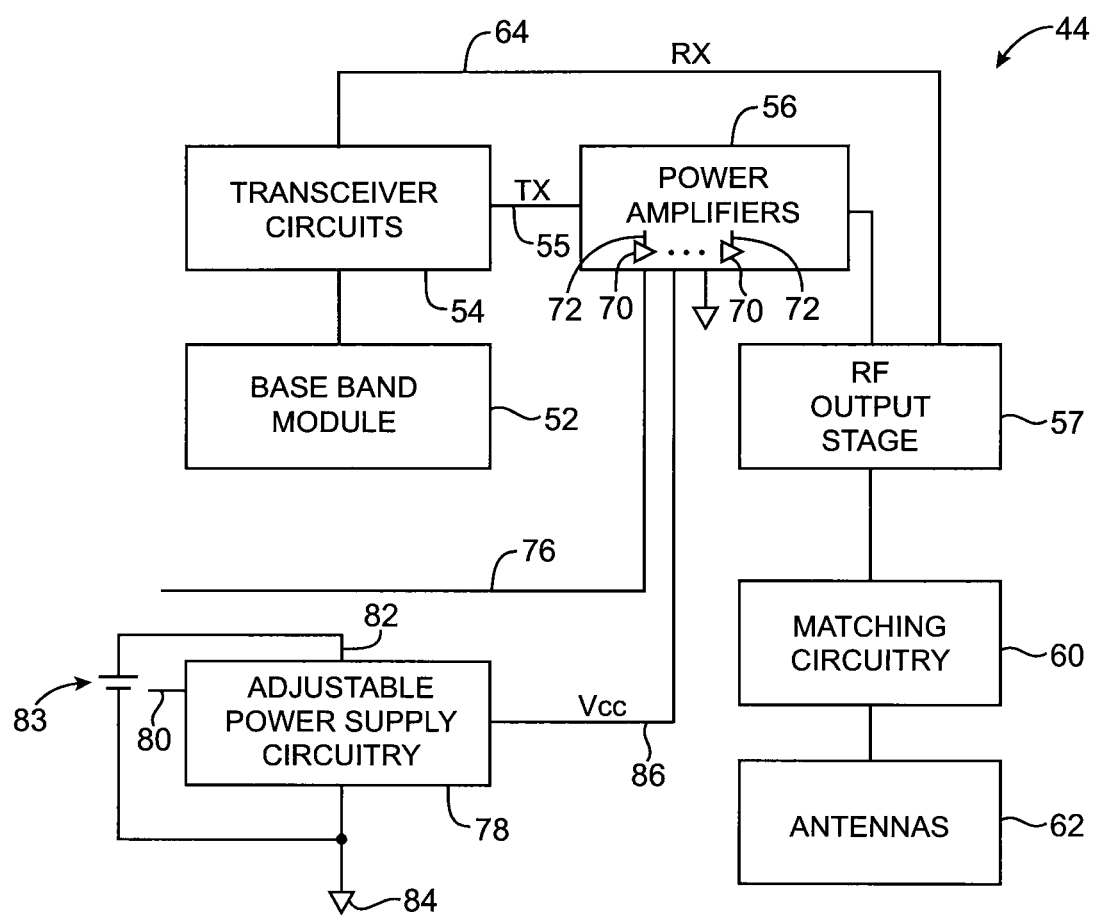
FIG. 3 is a circuit diagram of illustrative wireless communications circuitry in accordance with an embodiment of the present invention.

Illustrative wireless communications devices 44 that may be used in device 10 are shown in FIG. 3. As shown in FIG. 3, wireless communications devices 44 may include one or more antennas such as antennas 62. Data signals that are to be transmitted by device 10 may be provided to baseband module 52 (e.g., from processing circuitry 36 of FIG. 2). Baseband module 52 may be implemented using a single integrated circuit (e.g., a baseband processor integrated circuit) or using multiple circuits. Baseband module 52 may provide data to be transmitted to transmitter circuitry within transceiver circuits 54. The transmitter circuitry may be coupled to power amplifier circuitry 56 via path 55.

During data transmission, power amplifier circuitry 56 may boost the output power of transmitted signals to a sufficiently high level to ensure adequate signal transmission. Radio-frequency (RF) output stage circuitry 57 may contain radio-frequency switches and passive elements such as duplexers and diplexers. The switches in RF output stage circuitry 57 may, if desired, be used to switch devices 44 between a transmitting mode and a receiving mode. Duplexer and diplexer circuits and other passive components in RF output stage may be used to route input and output signals based on their frequency.

Matching circuitry 60 may include a network of passive components such as resistors, inductors, and capacitors and ensures that antenna structures 62 are impedance matched to the rest of the circuitry 44. Wireless signals that are received by antenna structures 62 may be passed to receiver circuitry in transceiver circuitry 54 over a path such as path 64.

Each power amplifier (e.g., each power amplifier in power amplifiers 56) may include one or more power amplifier stages such as stages 70. As an example, each power amplifier may be used to handle a separate communications band and each such power amplifier may have three series-connected power amplifier stages 70. Stages 70 may have control inputs such as inputs 72 that receive control signals. The control signals may be provided using a control signal path such as path 76. In a typical scenario, processing circuitry 36 (FIG. 2) may provide control signals to stages 70 using a path such as path 76 and paths such as paths 72. The control signals from processing circuitry 36 may be used to selectively enable and disable stages 70.

By enabling and disabling stages 70 selectively, the power amplifier may be placed into different gain modes. For example, the power amplifier may be placed into a high gain mode by enabling all three of power amplifier stages 70 or may be placed into a low gain mode by enabling two of the power amplifier stages. Other configurations may be used if desired. For example, a very low gain mode may be supported by turning on only one of three gain stages or arrangements with more than three gain mode settings may be provided by selectively enabling other combinations of gain stages (e.g., in power amplifiers with three or more than three gains stages).

Adjustable power supply circuitry such as adjustable power supply circuitry 78 may be powered by battery 83. Battery 83 may supply a positive battery voltage to adjustable power supply circuitry 78 at positive power supply terminal 82 and may supply a ground voltage to adjustable power supply circuitry 78 at ground power supply terminal 84. Battery 83 may be a lithium ion battery, a lithium polymer battery, or a battery of any other suitable type.

Initially, the voltage supplied by battery 83 may be high. As battery 83 becomes depleted, the voltage supplied by battery 83 will tend to drop. By using adjustable power supply circuitry 78, the amount of voltage Vcc that is supplied to power amplifier circuitry 56 over power supply voltage path 86 may be maintained at a relatively constant value. This helps to avoid wasteful situations in which the circuitry of power amplifiers 56 is supplied with excessive voltages while battery 83 is fresh. Such excessive voltages may lead to undesirably large power consumption by circuitry 56.

Adjustable power supply circuitry 78 may be controlled by control signals received over a path such as path 80. The control signals may be provided to adjustable power supply circuitry 78 from processing circuitry 36 (FIG. 2) or any other suitable control circuitry. The control signals on path 80 may be used to adjust the magnitude of the positive power supply voltage Vcc that is provided to power amplifier circuitry 56 over path 86. These power supply voltage adjustments may be made at the same time as gain mode adjustments are being made to the power amplifier circuitry 56. By making both power supply voltage adjustments and gain level adjustments to power amplifier circuitry 56, power consumption by power amplifier circuitry 56 can be minimized and battery life may be extended under a variety of operating conditions.

Consider, as an example, a situation in which device 10 has received a transmit power command from a wireless base station that specifies a desired radio-frequency power to be transmitted by device 10. Processor 36 or other suitable processing circuitry on device 10 can determine appropriate settings for the gain level of power amplifier circuitry 56 and for the power supply voltage Vcc that is supplied to power amplifier circuitry 56. Control signals from processing circuitry 36 may be supplied power amplifier circuitry on path 76 that adjust the gain level of the power amplifier (e.g., by turning on and off certain gain stages 70 in power amplifier circuitry 56). Additional adjustments to the performance of the power amplifier circuitry may be made by using path 86 to supply a desired adjustable power supply voltage Vcc to power amplifier circuitry 56 from adjustable power supply circuitry 78 in accordance with control signals supplied on path 80. During these adjustments, the processing circuitry can take care to satisfy desired operating constraints on power amplifier circuitry 56 such as minimum desired output power settings and minimum values of adjacent channel leakage ratio (the ratio of transmitted power to adjacent channel power).

Wireless communications devices 44 may include circuitry for supporting any suitable types of wireless communications. For example, devices 44 may include circuitry for supporting traditional cellular telephone and data communications (sometimes referred to as "2G" communications). An example of 2G cellular telephone systems are those based on the Global System for Mobile Communication (GSM) systems. Devices 44 may also include circuitry for supporting newer communications formats (sometimes referred to as "3G" communications). These newer formats may support increased communications speeds and may be used for both data and voice traffic. Such formats may use wide band code-division multiple access (CDMA) technology.

Figure 4:
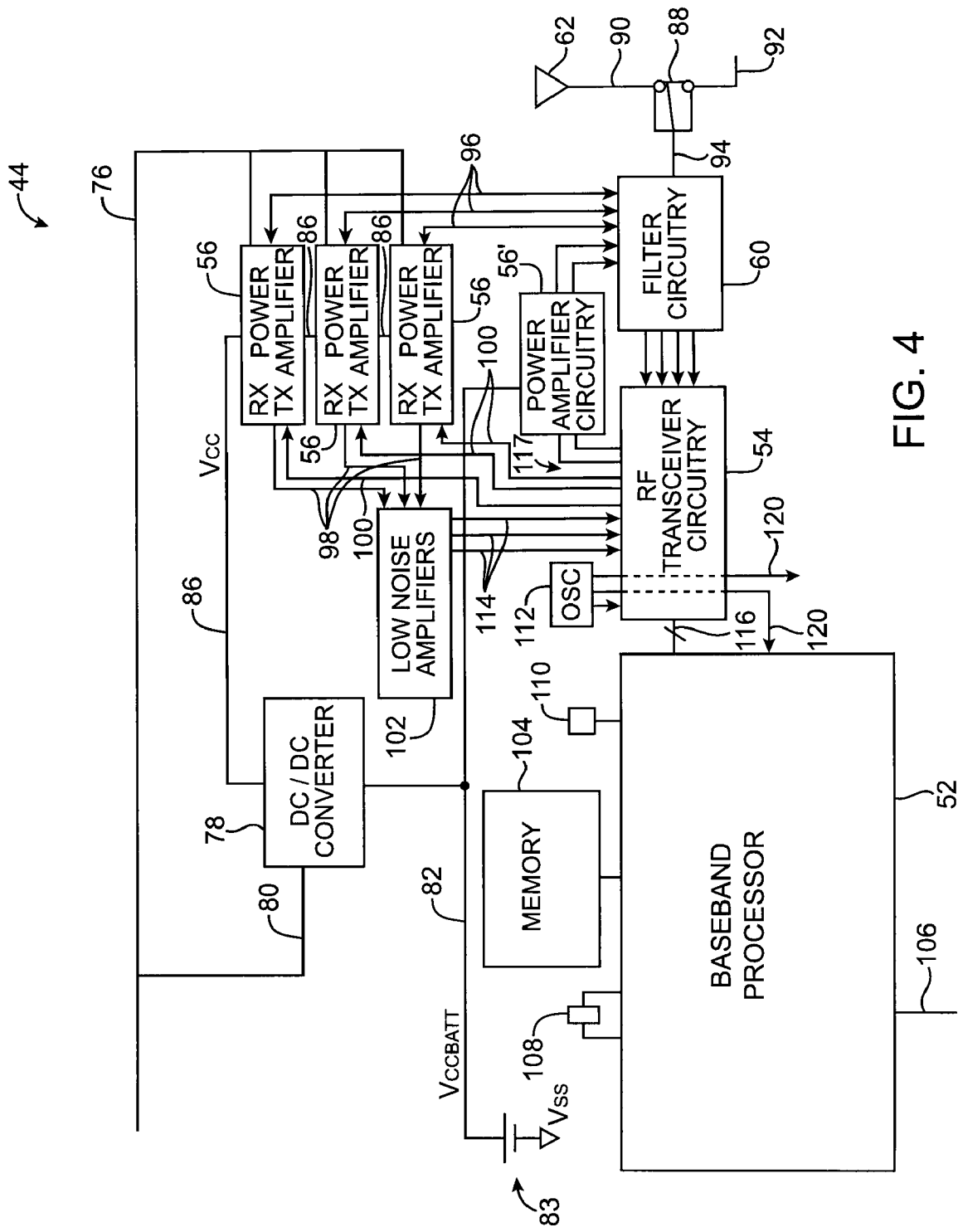
FIG. 4 is a circuit diagram of illustrative components that may be used in wireless communications circuitry with power management capabilities in accordance with an embodiment of the present invention.

Illustrative wireless communications devices 44 that may be used when it is desired to support both 2G and 3G wireless communications in the same portable electronic device are shown in FIG. 4.

In the illustrative arrangement of FIG. 4, radio-frequency signals are received and transmitted using antenna 62. Switch circuitry 88 may be used to selectively connect either test path 92 or antenna path 90 to path 94. During testing and calibration operations, path 92 may be connected to path 94. During normal operation, lines 94 and 90 are electrically connected to each other, so that antenna signals are routed between antenna 62 and filter circuitry 60. Filter circuitry 60 may include any suitable active and/or passive filter components, such as surface acoustic wave (SAW) devices, inductors, capacitors, resistors, etc. Filter circuitry 60 may be used, for example, to reject out-of-band signals.

When it is desired to use devices 44 to communicate over a 2G link, radio-frequency signals may be transmitted and received though circuit block 56'. Circuitry 56' may include power amplifiers that are used to amplify transmitted radio-frequency signals. Illustrative bands that may be handled using block 56' include 850 MHz, 900 MHz, 1800 MHz, 1900 MHz, and 2100 MHz (2170 MHz).

When it is desired to use devices 44 to communicate over a 3G link, radio-frequency signals may be transmitted and received through power amplifiers 56. Power amplifiers 56 may have associated baluns for impedance matching and duplexer circuitry that separates received and transmitted signals. Received signals may be conveyed from power amplifiers 56 to low noise amplifiers 102 over paths 98. Transmitted signals may be conveyed to power amplifiers 56 via paths 100. Low noise amplifier circuitry 102 may amplify received radio-frequency signals before these signals are provided to radio-frequency transceiver circuitry 54 over paths 114. Low noise amplifiers 102 may each include three gain stages (as an example). Radio-frequency signals that are to be transmitted may be conveyed from RF transceiver circuitry 54 to power amplifiers 56 over paths 100.

Adjustable power supply circuitry 78 may be implemented using a DC/DC converter or any other suitable power conversion circuit. Circuitry 78 may receive a relatively higher voltage Vccbatt from battery 83 over power supply path 82 and may produce a corresponding regulated power supply voltage Vcc at a relatively lower voltage Vcc at output path 86. In a typical arrangement, the battery voltage Vccbatt may range from about 4.3 volts to about 3.4 volts and output voltage Vcc may range from about 3.4 volts to 3.1 volts. The voltage Vcc may be adjusted based on control signals received over path 80. Voltage Vcc may be adjusted continuously (e.g., to provide any desired output voltage in the range of 3.1 to 3.4 volts or other suitable range) or may be set to one of two or more discrete levels (e.g., 3.1 volts, 3.4 volts, etc.). The unregulated power supply voltage Vccbatt may be used in powering power amplifier circuitry 56' (if desired).

Each power amplifier 56 may be used to handle a different communications band (e.g., bands at communications frequencies such as 850 MHz, 900 MHz, 1800 MHz, and 1900 MHz). If desired, some or all of power amplifiers 56 may handle multiple communications bands (e.g., adjacent bands).

Power amplifiers 56 may receive control signals over path 76. The control signals may be used to selectively turn on and off particular blocks of circuitry within each power amplifier. This type of adjustment may be used to place each power amplifier 56 in a desired gain mode. In a bimodal arrangement, each power amplifier may be placed in either a high gain mode or a low gain mode. If desired, other types of multimode arrangements may be supported (e.g., arrangements in which power amplifiers 56 can be adjusted to operate at three or more different gain settings.)

Baseband processor 52 may receive signals to be transmitted over antenna 62 at input line 106 (e.g., from processing circuitry 36). Baseband processor 52 may provide signals that are to be transmitted to RF transceiver circuitry 54. Transmitted 2G signals may be provided to power amplifier circuitry 56' over path 117. Transmitted 3G signals may be provided to power amplifier circuitry 56 over paths 100. Path 116 may be used to convey signals between baseband processor 52 and radio-frequency transceiver circuitry 54. Clock sources such as oscillator 112 and oscillator 108 may be used to provide clock signals for the circuitry in devices 44. As shown by lines 120, signals from oscillator 112 may be shared with components other than radio-frequency transceiver circuitry 54. Memory 104 may be used to store data for baseband processor 52. Memory 104 may be, for example, 8-16 MB of static random-access memory (SRAM).

Figure 5:
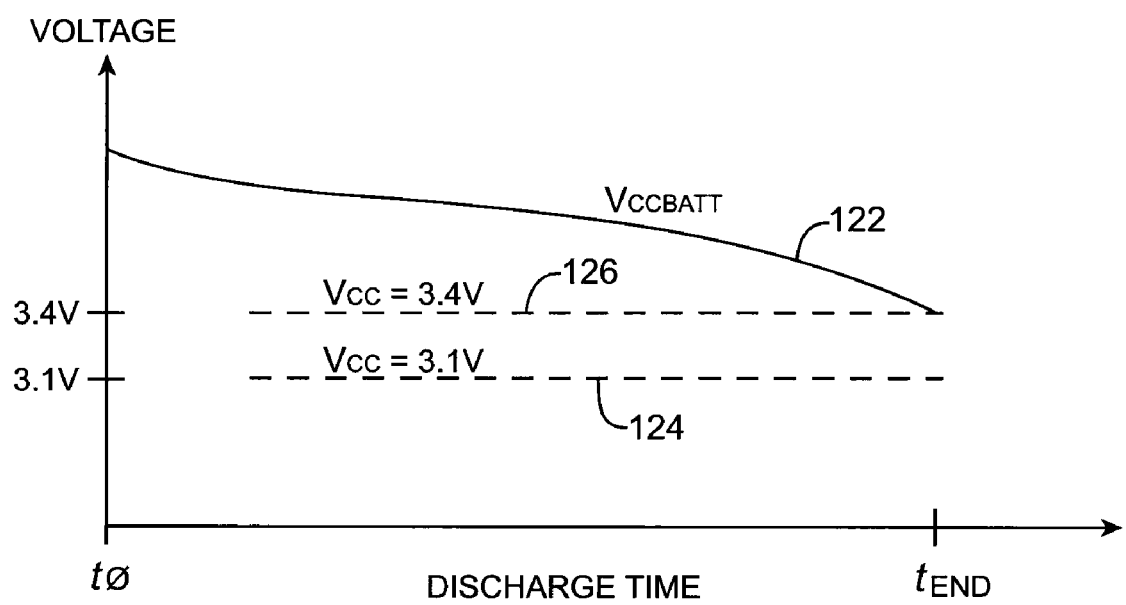
FIG. 5 is a graph showing how battery voltage may decrease with time and how the output of a voltage regulator such as a dc-to-dc converter may be adjusted in accordance with an embodiment of the present invention.

Batteries tend to lose voltage as they become depleted. A graph showing how the voltage Vccbatt at the output of battery 83 may decrease with time is shown in FIG. 5. As shown in FIG. 5, battery 83 may be characterized by a voltage versus time curve such as curve 122. Initially, at time to, battery 83 may have a relatively high voltage (e.g., a voltage of greater than 4.0 volts). As the battery is used to power electronic components in device 10, the battery becomes depleted and the magnitude of Vccbatt begins to fall. Eventually, the battery voltage Vccbatt drops to its lowest acceptable level (e.g., 3.4 volts) at time $t_{end}$.

Components such as power amplifiers 56 do not always need to run at the maximum available battery voltage Vccbatt. Operating such components at battery voltages such as these can therefore waste power. To minimize the amount of wasted power, DC/DC converter circuitry 78 may be used to convert the unregulated and fluctuating voltage Vccbatt from its sometimes relatively high voltage levels to a more moderate, fixed power supply voltage level Vcc. The value of Vcc might be, for example, 3.1 volts or 3.4 volts (as an example). Because Vcc is significantly less than the maximum value of Vccbatt, power amplifiers 56 are not overpowered and may therefore be powered efficiently.

In accordance with embodiments of the present invention, the output of DC/DC converter 78 may be adjusted in real time to further minimize power consumption while ensuring the power amplifiers 56 can operate satisfactorily to meet time-varying operating constraints (e.g., desired output power levels, desired noise levels, etc.). Consider, as an example, a situation in which device 10 receives a transmit power command (TPC) from a wireless network that informs device 10 that the amount of required radio-frequency power that is to be transmitted in a particular communications band is fairly low. In this type of situation, it is not necessary to operate the power amplifier 56 corresponding to that communications band at its highest voltage. Rather, a reduced voltage Vcc may be used. As a result, device 10 can instruct DC/DC converter 78 to produce a voltage Vcc at its output of 3.1 volts, as indicated by dashed line 124 in FIG. 5. If, on the other hand, device 10 receives a command indicating that the output power from device 10 should be maximized, DC/DC converter 78 may be used to produce a higher power supply voltage Vcc such as a 3.4 volt voltage Vcc corresponding to dashed line 126 of FIG. 5.

Figure 6:
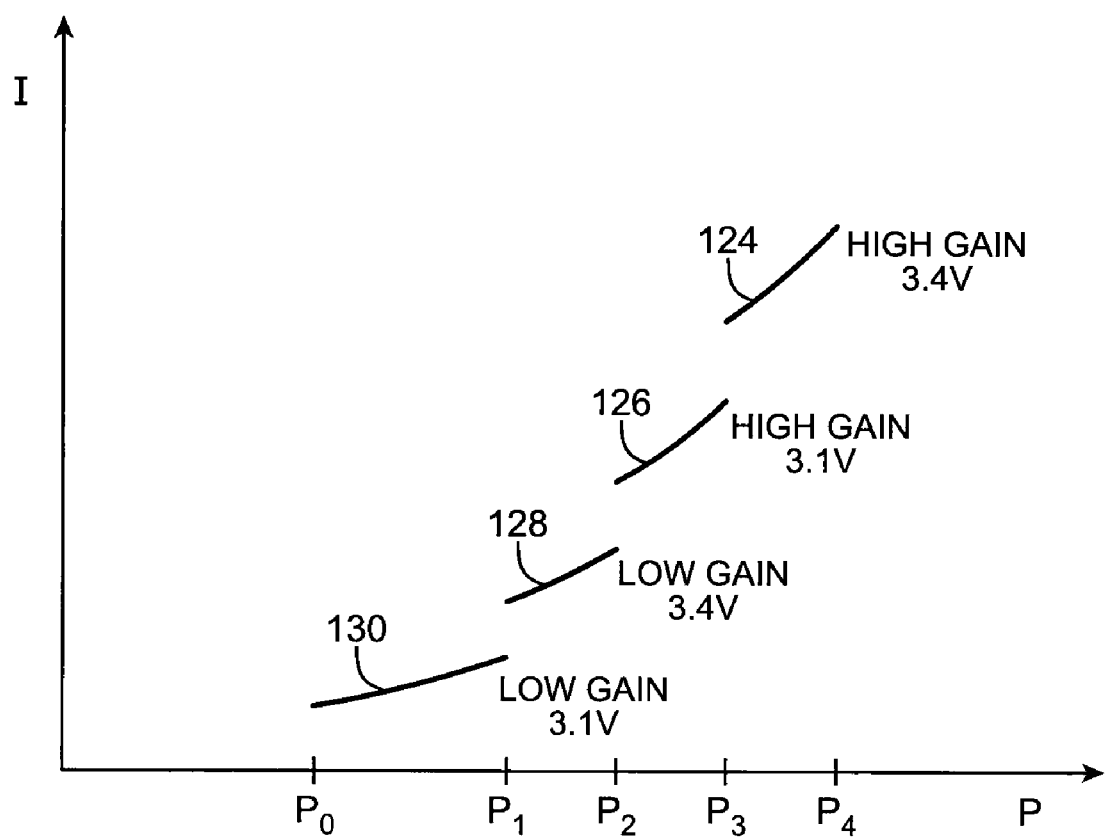
FIG. 6 is a graph showing how the amount of current consumed by a radio-frequency power amplifier in wireless communications circuitry may be adjusted by adjusting the gain setting and power supply voltage for the radio-frequency power amplifier in accordance with an embodiment of the present invention.

Adjustments to Vcc may be made in real time to accommodate different radio-frequency (RF) output power needs for device 10. The gain setting for amplifiers 56 may also be adjusted in real time as needed to meet the output power needs of device 10 while conserving power consumption when possible. The performance of devices 44 of FIG. 4 in a situation in which both power supply voltage adjustments to Vcc and gain level adjustments to power amplifiers 56 are being made is illustrated by the graph of FIG. 6. In FIG. 6, the current consumption of power amplifier 56 is plotted as a function of radio-frequency output power P. The trace of FIG. 6 shows how both adjustments to power supply voltage Vcc and adjustments to the amplifier's gain mode setting affect output power and current consumption Consider, as an example, the situation in which an output power of P4 is required. In this case, power amplifier 56 may be placed in a "high gain" mode in which all of its gain stages are active. To achieve maximum output power, power amplifier 56 may also be operated at a Vcc voltage of 3.4 volts by proper adjustment of DC/DC converter 78. This set of operating conditions is characterized by line segment 124 of FIG. 6.

If a lower output power such as power P3 is required, it may be possible to reduce the amount of current consumed by the power amplifier by lowering the voltage Vcc to a value such as 3.1 volts. As shown by line segment 126 of FIG. 6, this results in a lowering of the amount of current consumed by power amplifier 56.

If an output power of P2 is required, it may be possible to further reduce current consumption by adjusting the gain mode setting of the power amplifier. Power amplifier 56 has gain stages that can be selectively disabled when they are not needed. This allows power amplifier 56 to be placed in a configuration in which less current is consumed. When only an output power of P2 is required, power amplifier 56 may be placed in its "low gain" mode by shutting off one or more of its gain stages. As indicated by line segment 128, during this portion of the low gain mode operation of power amplifier 56, the output of DC/DC converter (power supply Vcc) may be set to its high voltage setting of 3.4 volts to ensure that appropriate operating constraints are satisfied (e.g., signal-to-noise constraints, etc.).

As shown by line segment 130, another operating configuration is possible. For example, when the required output power is P1, both the gain mode of the power amplifier and the power amplifier's power supply voltage Vcc may be reduced. When operating in "low gain" mode at a voltage of 3.1 volts, current consumption is minimized.

If desired, the magnitude of power supply voltage Vcc may be adjusted among more than two different discrete operating voltages or may be adjusted continuously. A graph showing how an adjustable power supply circuit such as an adjustable dc-to-dc converter with a continuously variable output voltage Vcc may provide a radio-frequency power amplifier with suitable power supply voltages Vcc at various different power amplifier gain settings according to required values of transmitted radio-frequency power P is shown in FIG. 7.

Figure 7:
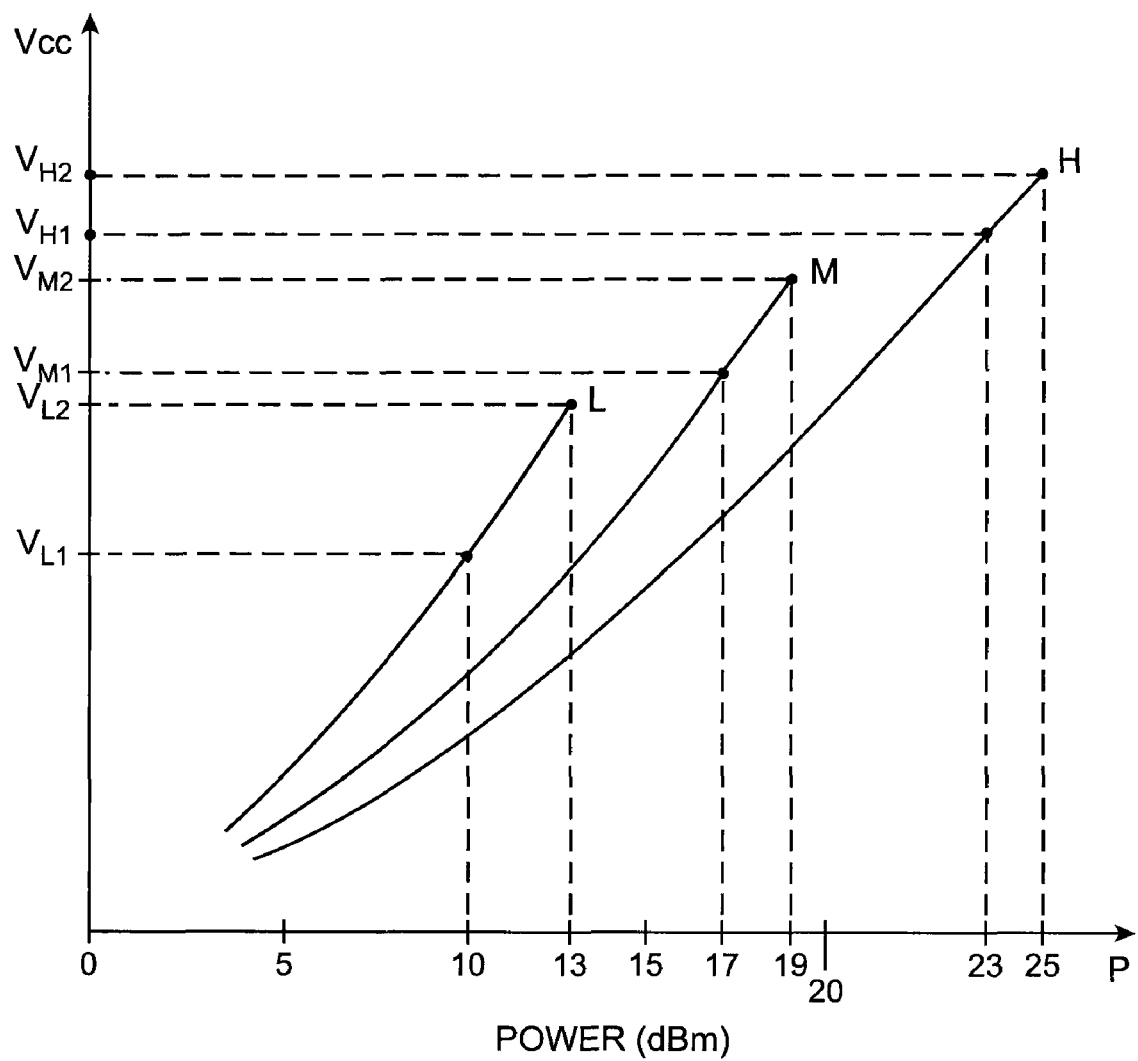
FIG. 7 is a graph showing how an adjustable power supply circuit such as an adjustable dc-to-dc converter may provide a radio-frequency power amplifier with different power supply voltages and how different power amplifier gain settings may be used when supplying various amounts of radio-frequency output power in accordance with an embodiment of the present invention.

As shown in FIG. 7, a power amplifier such as one of power amplifiers 56 may be characterized by three gain settings (as an example). In the FIG. 7 example, various gain stages in power amplifier 56 may be selectively enabled so that power amplifier may be set to operate in one of three gain modes. In the highest of the three gain modes, the power amplifier may be characterized by line "H." In the lowest of the three gain modes, the power amplifier may be characterized by line "L." In an intermediate gain mode, the power amplifier may operate according to line "M."

The curves of FIG. 7 show how the power supply voltage Vcc for the power amplifier may be reduced to minimize power consumption. The amount of power that may be saved depends, in general, on the amount of output power that is required at the output of power amplifier 56. When required (e.g., in accordance with a wireless network TPC instruction or other requirement), the power amplifier may be operated in its maximum gain mode and at its highest operating voltage Vcc. For example, when an output power of 25 dBm is required (in the FIG. 7 example), the power amplifier may be placed in its high gain mode and may be powered with a power supply voltage of Vh2. When a lower output power is required, such as 23 dBm, it is no longer necessary to operate the power amplifier at Vh2. Rather, the power supply voltage for the power amplifier may be reduced to a Vcc value of Vh1. This helps reduce power consumption. If an output power of 19 dBm is required, power consumption can be reduced further by placing the power amplifier in its medium gain mode and reducing the power supply voltage to Vm2. If less power is required (e.g., 17 dBm), the power supply voltage can be reduced further to Vm1. At still lower values of required output power, the power amplifier can be placed in its lowest gain mode (characterized by line L). If, as an example, 13 dBm of output power is needed, the power amplifier may be operated at a power supply voltage of Vl2. If only 10 dBm of output power is required, the power supply voltage produced by the adjustable power regulator may be reduced to Vl1.

Figure 8:
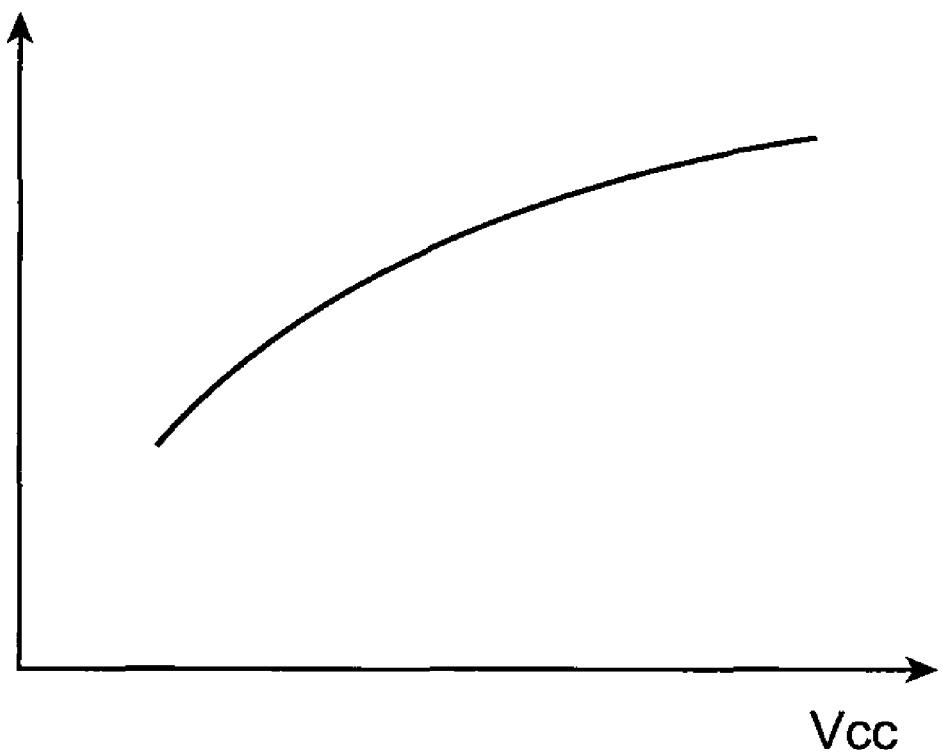
FIG. 8 is a graph showing how power amplifier efficiency may be greatest at relatively large power supply voltages in electronic devices using wireless communications circuitry in accordance with an embodiment of the present invention.
Figure 9:
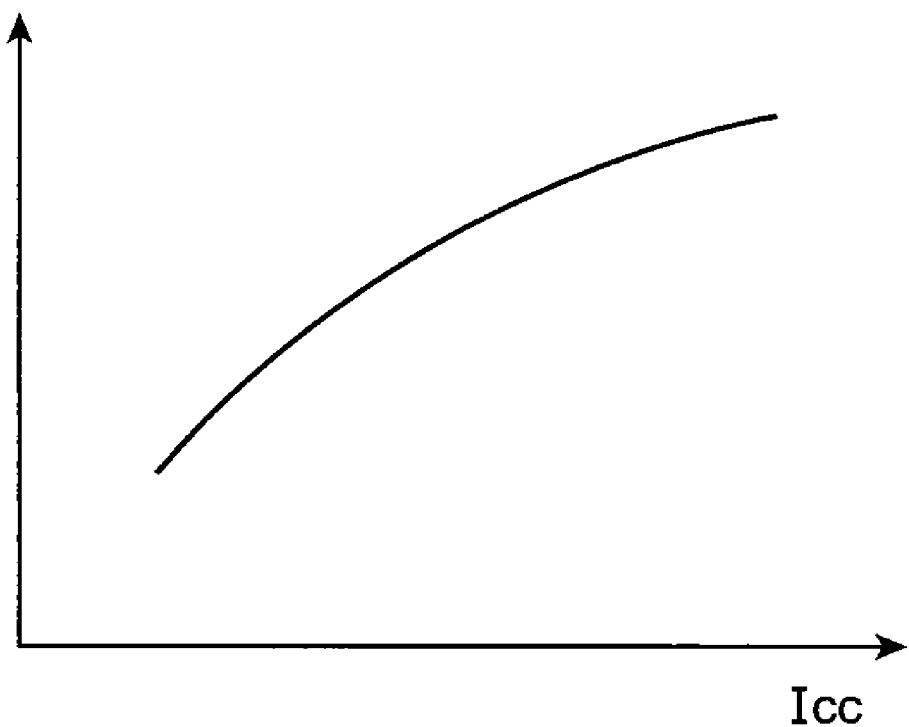
FIG. 9 is a graph showing how power amplifier efficiency may be greatest at relatively large operating currents in electronic devices using wireless communications circuitry in accordance with an embodiment of the present invention.

As the example of FIG. 7 illustrates, both gain mode adjustments and power amplifier power supply voltage adjustments can be used in reducing power consumption for power amplifier 56. If desired, the potential inefficiencies of DC/DC converter 78 under certain operating conditions may be taken into account when making adjustments of this type. As shown in FIGS. 8 and 9, the efficiency of DC/DC converter 78 (and other such power regulator circuitry) may be affected by the operating voltage Vcc and operating current Icc that DC/DC converter 78 produces at its output. At high output voltages Vcc and high output currents Icc, adjustable power supply circuitry such as DC/DC converters may operate at peak efficiency. At lower Vcc and Icc levels, efficiency tends to drop. It may therefore be most efficient to reduce power supply voltage Vcc only in situations in which the power amplifier power savings that are obtained by reducing Vcc are not offset by increases in power consumption in DC/DC converter 78. When Vcc is reduced, the values of power supply current and voltage that are used in powering power amplifier 56 tend to fall and overall power consumption will be reduced, so long as the reductions in power amplifier power consumption are not overwhelmed by power losses due to operating power supply circuitry 78 in an inefficient regime.

Figure 10:
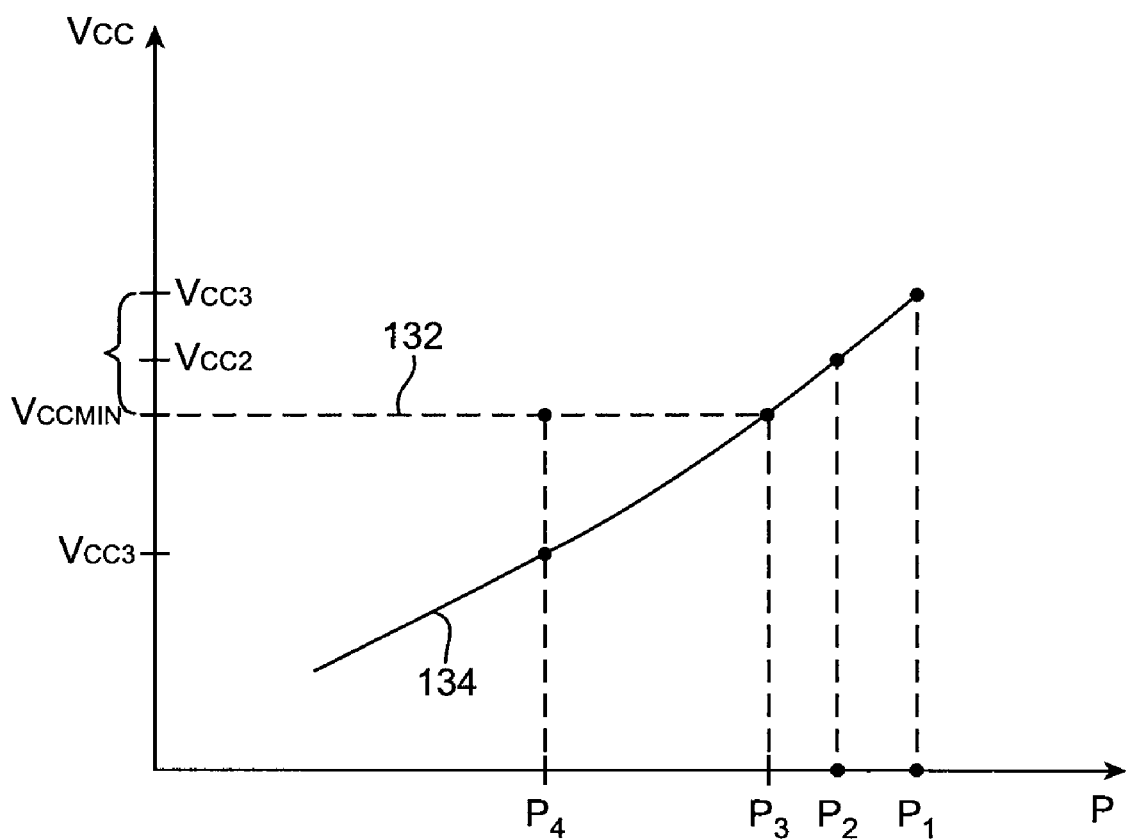
FIG. 10 is a graph showing how power amplifier power supply voltage may be adjusted as a function of various required radio-frequency power requirements in accordance with an embodiment of the present invention.

Consider, as an example, the graph of FIG. 10. In this example, power amplifier 56 has only a single gain setting. As shown in FIG. 10, at a required power amplifier output power of P1, it may be necessary to operate the power amplifier with a relatively large power supply voltage Vcc3. If less output power is required for a given set of operating conditions, power consumption may be minimized by reducing Vcc. For example, if the output power level that is required is P2, it may be possible to save power by reducing the power supply for power amplifier 56 to Vcc2. Sometimes even lower output powers are required, such as output power P4. If the inefficiencies associated with operating DC/DC converter 78 at low currents and voltages were neglected, it might be possible to minimize power consumption by operating power amplifier 56 at voltage Vcc3. However, in practice, the inefficiencies associated with operating DC/DC converter 78 at low current and voltage levels can cause the power consumption by DC/DC converter 78 to become increasingly significant at low output power levels. As a result, overall power consumption in device 10 may be minimized by restricting the minimum value of Vcc that is supply to power amplifier 56 by DC/DC converter 78. In this type of arrangement, the voltage Vcc that is applied to power amplifier 56 may follow dashed line 132 rather than solid line 134 for output powers below about P3.

Figure 11:
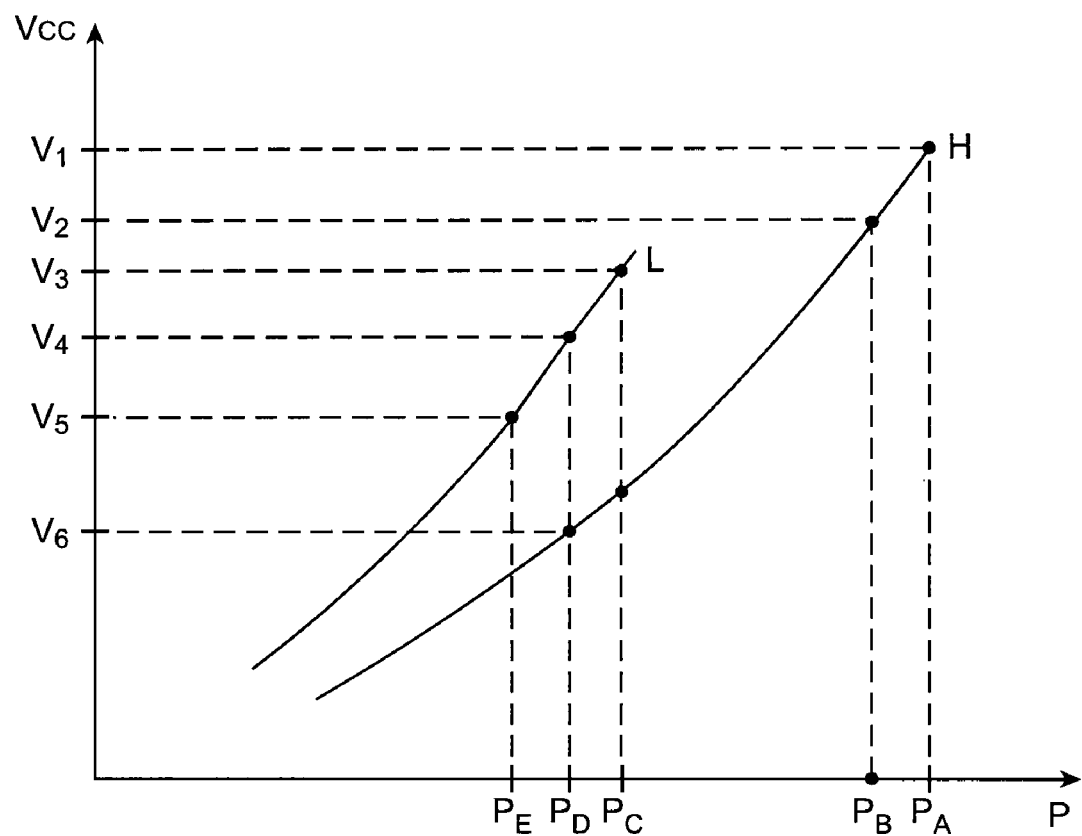
FIG. 11 is a graph showing how power amplifier gain settings and power supply voltages may be adjusted to accommodate various different transmitted radio-frequency power requirements in accordance with an embodiment of the present invention.

Power conversion inefficiency in DC/DC converter 78 may also affect the operation of device 10 in scenarios in which power amplifiers 56 are adjusted between various gain settings. This type of situation is illustrated in FIG. 11. As shown in FIG. 11, at a high output power such as power PA, it may be desirable to operate power amplifier 56 in a high gain mode, characterized by high gain line H, while powering power amplifier 56 at a Vcc level of V1. If less power is required, power consumption can be minimized by reducing Vcc. For example, when the output power requirement is PB, power amplifier 56 may be operated at voltage V2.

At particularly low output powers such as output power PE, the lowest overall power consumption for device 10 may be obtained by placing power amplifier in low gain mode, characterized by line L and by reducing Vcc to V5.

Depending on the efficiency of DC/DC converter 78, it may or may not be beneficial to switch power amplifier 56 to low gain mode when producing intermediate output power levels. When power amplifier 56 is switched from high gain mode to low gain mode, the amount of current drawn by power amplifier 56 decreases. The amount of current consumed by power amplifier 56 is therefore generally less when power amplifier 56 is operated according to line L of FIG. 11 rather than line H of FIG. 11. However, because of the inefficiencies of FIGS. 8 and 9, the overall amount of power consumed by device 10 may increase when power amplifier 56 is switched to low gain mode.

At a required output power level of PD, there are two possible operating scenarios in the example of FIG. 11. In the first scenario, power amplifier 56 is operated in high gain mode (line H) at a power supply voltage V6. In the second scenario, power amplifier 56 is operated in low gain mode (line L) at power supply voltage V4. When power amplifier 56 is operated in low gain mode, some of its circuitry is disabled (i.e., a power amplifier gain stage is turned off). This generally allows power consumption to be reduced. As a result, if DC/DC converter 78 is fairly efficient, it may be possible to minimize overall power consumption by operating power amplifier 56 in low gain mode (line L) at voltage V4. However, when power amplifier 56 is switched to low gain mode (line L), the amount of current drawn by power amplifier 56 may drop significantly. As a result, DC/DC converter 78 may be forced to operate in an inefficient low current regime, as shown in FIG. 9. The increased power consumption that results when operating DC/DC converter 78 in its low efficiency regime may overwhelm the potential power consumption savings when operating power amplifier in its low gain mode. It may therefore be more efficient to operate power amplifier 56 in its high gain mode (line H) at power supply voltage V6. Eventually, at particularly low output power requirements, the power savings from low gain mode operation may outweigh the increased power consumption in DC/DC converter 78. It may therefore be beneficial to operate power amplifier 56 in low gain mode (line L) using a power supply voltage of V5 when an output power of PE is required.

As this example demonstrates, it may not always be optimal to switch between higher and lower gain modes as soon as the lower gain modes become available. It may not, for example, be beneficial to switch to low gain mode when producing power PC (using power supply voltage V3). It may only be beneficial to switch to low gain modes at lower output power scenarios such as below output power PD (as an example).

Figure 12:
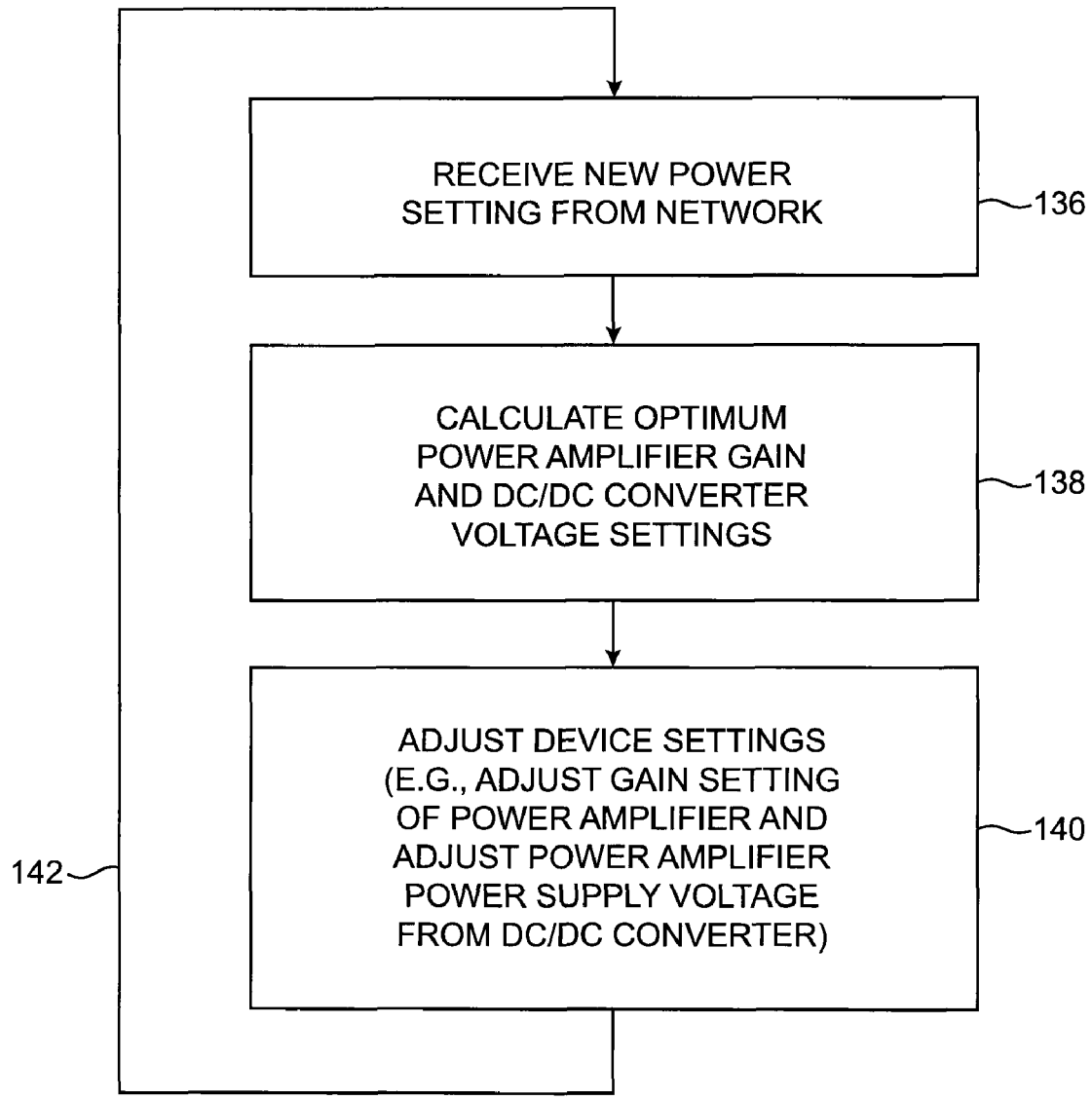
FIG. 12 is a flow chart of illustrative steps involved in using radio-frequency power amplifier gain and power supply voltage adjustments in managing power consumption in wireless communications circuitry for a portable electronic device in accordance with an embodiment of the present invention.

Illustrative steps involved in using radio-frequency power amplifier gain and power supply voltage adjustments to manage power consumption in wireless communications circuitry for a portable electronic device are shown in the flow chart of FIG. 12. At step 136, device 10 may receive desired radio-frequency signal output power settings. For example, network equipment that is monitoring the received signal quality from multiple handsets may send a transmit power control (TPC) instruction to device 10. The TPC instruction may specify a desired output power level for device 10 to use in transmitting radio-frequency signals. This power level may be selected by the network equipment to reduce interference with other devices in the network while maintaining adequate signal strength for supporting wireless communications.

At step 138, processor 36 may compute an optimum setting for the gain of power amplifier 56 (e.g., how many gain stages in amplifier 56 are to be enabled) and an optimum setting for the output of DC/DC converter 78 based on expected levels of power consumption at various power supply voltages Vcc and gain settings (gain modes). These settings may be computed by custom logic, using a general purpose processor, using a processor associated with baseband functions (e.g., baseband processor 52 of FIG. 4), or using a combination of these circuits or other suitable circuitry. If desired, the optimal settings that are computed may take into account the efficiency characteristics of DC/DC converter 78 at various current and voltage levels.

At step 140, the settings of device 10 may be adjusted. For example, DC/DC converter 78 may be adjusted to produce a desired value of Vcc at its output and power amplifier circuit 56 may be adjusted to place it into a desired gain mode.

As indicated by line 142, control may then loop back to step 136. The process of FIG. 12 may be performed continuously (as an example) whenever it is desired to communicate using wireless communications devices 44 (and power amplifiers 56).

The foregoing is merely illustrative of the principles of this invention and various modifications can be made by those skilled in the art without departing from the scope and spirit of the invention.

What is claimed is:

1. Wireless communications circuitry on a portable electronic device wherein the wireless communications circuitry operates using power from a battery, the wireless communications circuitry comprising:
    at least one radio-frequency power amplifier that amplifies radio-frequency signals that are transmitted from the portable electronic device;
    at least one additional radio-frequency power amplifier that receives power directly from the battery; and
    adjustable power supply circuitry that supplies an adjustable power supply voltage to the radio-frequency power amplifier.

2. The wireless communications circuitry defined in claim 1 further comprising:
    a battery input in the adjustable power supply circuitry that receives a battery voltage from the battery; and
    a power supply voltage output at which the adjustable power supply voltage is supplied to the radio-frequency power amplifier, wherein the adjustable power supply voltage is less than the battery voltage.

3. The wireless communications circuitry defined in claim 2 wherein the adjustable power supply circuitry comprises a dc-to-dc converter.

4. The wireless communications circuitry defined in claim 1 wherein the radio-frequecy power amplifier comprises at least one adjustable gain mode radio-frequency power amplifier that amplifies the radio-frequency signals that are transmitted from the portable electronic device in accordance with a gain mode level setting, the wireless communications circuitry further comprising baseband processor circuitry that generates control signals that adjust the gain mode level setting of the radio-frequency power amplifier.

5. The wireless communications circuitry defined in claim 1 wherein the radio-frequency power amplifier comprises a plurality of gain stages that are selectively enabled to adjust a gain mode level setting, wherein the plurality of gain stages are selectively enabled to adjust the gain mode level setting between at least a first gain setting and a second gain setting, and wherein the first gain setting is larger than the second gain setting.

6. The wireless communications circuitry defined in claim 5 further comprising a baseband processor integrated circuit that generates control signals that adjust the gain mode level setting of the radio-frequency power amplifier.

7. The wireless communications circuitry defined in claim 6 wherein the adjustable power supply circuitry comprises a dc-to-dc converter.

8. The wireless communications circuitry defined in claim 1 wherein the radio-frequency power amplifier comprises at least one adjustable gain mode radio-frequency power amplifier that amplifies the radio-frequecy signals that are transmitted from the portable electronic device in accordance with a gain mode level setting, the wireless communications circuitry further comprising a baseband processor integrated circuit that generates control signals that adjust the gain mode level setting of the radio-frequency power amplifier.

9. The wireless communications circuitry defined in claim 8 wherein the adjustable power supply circuitry comprises a dc-to-dc converter.

10. The wireless communications circuitry defined in claim 1 wherein the radio-frequency power amplifier comprises a plurality of gain stages that are selectively enabled to adjust a gain mode level setting, wherein the plurality of gain stages are selectively enabled to adjust the gain mode level setting between at least a first gain setting and a second gain setting, wherein the first gain setting is larger than the second gain setting, wherein a first number of the plurality of gain stages are selectively enabled to adjust the gain mode level setting to the first gain setting, wherein a second number of the plurality of gain stages are selectively enabled to adjust the gain mode level setting to the second gain setting, and wherein the first number of the plurality of gain stages is greater than the second number of the plurality of gain stages.

11. The wireless communications circuitry defined in claim 1 wherein the radio-frequency power amplifier comprises a plurality of gain stages that are selectively enabled to adjust a gain mode level setting, wherein the plurality of gain stages are selectively enabled to adjust the gain mode level setting between at least a first gain setting and a second gain setting, wherein the first gain setting is larger than the second gain setting, wherein at least a given one of the plurality of gain stages is selectively enabled to adjust the gain mode level setting to the first gain setting, wherein at least the given one of the plurality of gain stages is selectively disabled to adjust the gain mode level setting to the second gain setting.

12. A method for operating portable electronic device wireless communications circuitry having a radio-frequency power amplifier with multiple gain modes, an adjustable power supply, and an additional radio-frequency power amplifier, the method comprising:
    applying control signals to the radio-frequency power amplifier to place the radio-frequency power amplifier in a selected one of the multiple gain modes;
    with the adjustable power supply, providing an adjustable power supply voltage to the radio-frequency power amplifier; and
    with the additional radio-frequency power amplifier, receiving a battery voltage directly from a battery.

13. The method defined in claim 12, wherein the control signals comprise gain mode level control signals, wherein applying the control signals comprises:
    with a baseband processor integrated circuit, generating the gain mode level control signals.

14. The method defined in claim 13 further comprising:
    reducing the adjustable power supply voltage while maintaining the radio-frequency power amplifier in a given one of the gain modes to conserve power.

15. The method defined in claim 12 wherein the wireless communications circuitry is part of a portable electronic device that communicates with wireless network equipment, the method further comprising:
    receiving transmit power control commands from the network equipment with the wireless communications circuitry; and
    in accordance with the received transmit power control commands, simultaneously adjusting both the gain mode of the radio-frequency power amplifier and the power supply voltage produced by the adjustable power supply to minimize power consumption.

16. The method defined in claim 15 wherein adjusting the power supply voltage produced by the adjustable power supply comprises adjusting an output voltage produced by a dc-to-dc converter.

17. The method defined in claim 12 wherein applying the control signals comprises:
applying at least a first control signal to place the radio-frequency power amplifier in a first gain mode, wherein the first control signal selectively enables at least a given portion of the radio-frequency power amplifier; and
applying at least a second control signal to place the radio-frequency power amplifier in a second gain mode that is less than the first gain mode, wherein the second control signal selectively disables at least the given portion of the radio-frequency power amplifier.

18. A portable electronic device that is powered by a battery, comprising:
an adjustable power supply that receives a battery voltage from the battery and that produces a corresponding adjustable power supply voltage;
antenna structures;
a first set of radio-frequency power amplifiers that receive power directly from the battery; and
a second set of radio-frequency power amplifiers that amplify radio-frequency signals that are transmitted through the antenna structures, wherein the second set of radio-frequency power amplifiers are powered by the adjustable power supply voltage and are responsive to gain mode control commands.

19. The portable electronic device defined in claim 18 further comprising:
a baseband processor integrated circuit that supplies the gain mode control commands to the second set of radio-frequency power amplifiers to adjust each of the second set of radio-frequency power amplifiers to selectively operate in high gain and low gain modes.

20. The portable electronic device defined in claim 19 wherein the adjustable power supply comprises a dc-to-dc converter that supplies at least a first power supply voltage and a second power supply voltage, wherein the first power supply voltage is less than the second power supply voltage.

21. The portable electronic device defined in claim 18 further comprising a transceiver circuit that receives transmit power commands through the antenna structures, wherein the second set of radio-frequency power amplifiers are responsive to gain mode control commands and wherein the adjustable power supply voltage and gain mode control commands are generated in real time to adjust power amplifier power consumption in accordance with the transmit power commands.

* * * * *